(12) United States Patent
Adamczyk et al.

(10) Patent No.: US 6,296,707 B1
(45) Date of Patent: Oct. 2, 2001

(54) APPARATUS FOR COATING A SURFACE OF ONE OR MORE LENSES

(75) Inventors: Anthony P. Adamczyk, Manchester; Glenn E. Bowley, Willington; John Dahill, Manchester; Richard Edwards, Windsor Locks; Lonzell Hall, Simsbury; Michael Payette, Windsor Locks; Sout Senethep, East Hartford; Peter Wilcox, Portland, all of CT (US); Heather Wilson, Wilbraham, MA (US)

(73) Assignee: Gerber Coburn Optical, Inc., South Windsor, CT (US)

( * ) Notice: Subject to any disclaimer, the term of this patent is extended or adjusted under 35 U.S.C. 154(b) by 0 days.

(21) Appl. No.: 09/271,183

(22) Filed: Mar. 17, 1999

(51) Int. Cl.[7] ............................. B05C 13/02; B05C 11/02; B05B 13/00; B05D 5/00; B05D 3/06
(52) U.S. Cl. ............................. 118/668; 118/52; 118/56; 118/58; 118/320; 118/500; 118/503; 118/695; 427/164; 427/165; 427/168; 427/425; 427/557; 427/558
(58) Field of Search ............................. 118/687, 696, 118/500, 503, 695, 680, 668, 712, 52, 56, 58, 72, 73, 320, 321; 427/164, 165, 168, 553, 557, 559, 425; 134/901; 8/507

(56) References Cited

U.S. PATENT DOCUMENTS

| | | |
|---|---|---|
| 4,353,325 | 10/1982 | Argazzi . |
| 4,765,270 | 8/1988 | Faber . |
| 5,271,953 | * 12/1993 | Litteral ....................................... 427/8 |
| 5,514,214 | * 5/1996 | Joel et al. ................................ 118/52 |
| 5,624,496 | 4/1997 | Scharf et al. . |
| 5,820,673 | * 10/1998 | Sentilles et al. ...................... 118/319 |

FOREIGN PATENT DOCUMENTS

| | | |
|---|---|---|
| 0 318 164 | 5/1989 | (EP) . |
| 0 882 518 | 12/1998 | (EP) . |
| 1 299 953 | 12/1972 | (GB) . |
| 2 045 709 | 11/1980 | (GB) . |

* cited by examiner

Primary Examiner—Richard Crispino
Assistant Examiner—J. A. Lorengo
(74) Attorney, Agent, or Firm—McCormick, Paulding & Huber LLP

(57) ABSTRACT

In an apparatus for coating a surface of at least one lens having pair of opposed major surfaces, al least one lens support is coupled to a frame and is rotatable relative thereto. A lens is releasably mounted to the lens support leaving one of the major lens surfaces exposed. A mounting plate is coupled to the frame and is positioned proximate to the lens support. A series of work stations are carried by the mounting plate for sequentially performing work operations on the exposed major surface of the lens. The lens support is indexable relative to the mounting plate to position the exposed lens surface adjacent to each of the work stations in response to commands issued from a controller.

34 Claims, 11 Drawing Sheets

APPARATUS FOR COATING A SURFACE OF ONE OR MORE LENSES

FIELD OF THE INVENTION

The present invention relates generally to equipment used in the manufacture of lenses and deals more particularly with an automated device for applying protective and other coatings to lens surfaces.

BACKGROUND OF THE INVENTION

Lenses, particularly those used in the manufacture of eyeglasses, are generally fabricated from a polymeric material, such as polycarbonate. While these materials are lightweight, making the eyeglasses more comfortable to wear, they are not overly scratch resistant. To address this problem, a scratch resistant coating is typically applied to the lens surfaces.

Sometimes, this coating is applied manually, subjecting the coating process to human error potentially resulting in the lens surface being unevenly coated causing distorted vision for the person wearing the eyeglasses incorporating these lenses. In addition to distorted vision, improperly applied coatings can also result in reduced scratch resistance on the lens surface. Often a dip coating process is employed where the lenses are immersed in a coating resin and then cured in an oven. This process is expensive and time consuming as the lens must be cured for several hours.

To minimize the possibility of human error, machinery has been developed to automate the lens coating process. However, these prior art machines are normally quite large and cumbersome, as well as expensive. These factors make it difficult for retail eyeglass suppliers to have such a machine in their establishments. Accordingly, in order to supply consumers with scratch resistant lenses, these retail outlets usually send the lenses to larger facilities possessing the coating machinery to have the coating applied to each lens. This increases the cost of, and the time a consumer must wait for the finished eyeglasses.

Based on the foregoing, it is the general object of the present invention to provide an apparatus that overcomes the difficulties and drawbacks of prior art lens coating techniques and machinery.

It is a more specific object of the present invention to provide a highly automated, cost effective apparatus sized for use in retail eyeglass outlets for applying a coating to a lens surface.

SUMMARY OF THE INVENTION

The present invention is directed to an apparatus for coating a surface of at least one lens having a pair of opposed major surfaces. The apparatus includes a frame having at least one lens support coupled thereto. Mounting means are provided for releasably retaining at least one lens on the lens support, leaving one of the major surfaces of the lens exposed. A mounting plate is coupled to the frame proximate to the lens support and is adapted to carry a plurality of work stations thereon for performing various different work operations on the exposed lens surface. Each of the work operations performed by each of the work stations involves a step related to coating a surface of at least one lens. Indexing means are also provided to effect relative motion between the mounting plate and the lens support to thereby facilitate the performance of the work operations on the exposed lens surface. A controller coordinates the sequence of the work operations to be performed on a lens in response to lens coating data stored therein.

In the preferred embodiment of the present invention, the abovedescribed work stations include a wash station for cleaning the exposed lens surface, a coating station for depositing and dispensing coating solution onto the exposed lens surface, and a curing station for solidifying the deposited coating solution. During operation of the apparatus, air is introduced between the mounting plate and the indexing means to maintain a positive pressure in the apparatus thereby minimizing the potential for foreign matter to find its way therein. The air is introduced via a fan, through a HEPA filter and flows laminarly between the mounting plate and the indexing means. In addition a pneumatic cylinder is mounted to the frame at one end and coupled to the mounting plate at an opposite end for moving the mounting plate between a working position wherein at least one of the plurality of work stations is positioned adjacent to the lens support for the performance of a particular work operation; and a non working position wherein the mounting plate is located away from the lens support to allow the lens support to be indexed relative to the mounting plate.

Preferably, the indexing means includes a turntable rotatably mounted to the frame and having two lens supports attached thereto. The turntable is rotationally indexable relative to the mounting plate by a suitable drive such as, but not limited to a servo motor or stepper motor. During operation, the controller coordinates the rotation of the turntable to position the lens supports proximate to the work stations facilitating the simultaneous performance of different work operations on each lens carried by each of the lens supports. For example, one of the lens supports can be positioned adjacent to the coating station while the other lens support is located adjacent to the washing station. Accordingly, a coating and washing operation, or, depending on the turntable position; a curing and coating operation can be accomplished simultaneously.

The lens supports each include a mounting adapter coupled thereto and defining a bore for carrying a resilient support member upon which the lens is seated. The support member has a plurality of perforations extending therethrough and is made from a suitable material such as silicone. Means are provided for drawing vacuum through the perforations in the support member for pulling the lens thereagainst, releasably retaining the lens on the lens support. In this manner the material of the support member and its resiliency allows a large areal portion of a lens surface to be supported, preventing any damage to the lens.

Preferably, the wash station includes a wash cup defining an interior area and having an opening adapted to receive the lens support and the exposed lens surface when the lens support is positioned proximate to the wash station. Means for depositing a quantity of high-pressure washing fluid onto the exposed lens surface are also included and are preferably in the form of a nozzle. The nozzle is located within the wash cup and in fluid communication with a reservoir filled with washing fluid, such as, but not limited to deionized water.

The lens supports are rotatably mounted to the turntable and spun in response to commands issued from the controller by suitable means such as, but not limited to a servo motor. During a washing operation, the servo motor causes the lens support and thereby the lens to rotate generating a centrifugal force that acts on the washing solution applied to the rotating, exposed lens surface, causing the washing solution to spread thereover. The washing solution is expelled from the exposed lens surface and collects in a gutter defined by the wash cup. The collected washing solution then drains into a collection basin supported by the frame. Subsequent to the removal of the washing solution, the rotation of the lens support is stopped and a drying solution is applied to the exposed lens surface via a second nozzle positioned in the wash cup and coupled to a pressurized reservoir containing the drying solution. Once the drying solution is applied, the lens support once again rotates the lens and excess drying solution is expelled from the lens surface collected in the gutter and drained into the collection basin.

The coating station includes a housing carried by the mounting plate and having an interior area defined by at least one housing wall. An opening is provided in the housing and in communication with the interior area for receiving one of the lens supports having a lens mounted thereon. Applicator means, preferably in the form of a nozzle, are located within the housing and are adjustable relative thereto for depositing a known quantity of at least one lens coating solution onto the exposed lens surface in response to commands issued from the controller.

As the coating solution is applied, the lens support, responsive to commands issued from the controller, rotates in the above-described manner imparting centrifugal force to the applied coating solution causing the solution to spread evenly across the lens surface. Excess coating solution is thrown from the lens and collects in a trough defined by the housing. The trough includes a drain that allows the collected coating solution to be transferred to a receptacle where it is exposed to ultra-violet radiation, thereby curing the collected coating solution. The solidified coating solution can then be easily disposed of. Alternatively, the collected coating solution can be recycled and applied to another lens.

Preferably, the means by which the coating solution is supplied to the nozzle includes a reservoir in the form of a resilient container defining a peripheral surface. A pressure vessel is positioned over the resilient container with a conduit extending from the nozzle through a top surface of the pressure vessel and into the container where an end of the conduit is immersed in the coating solution. Means for pressurizing the interior area of the pressure vessel are provided such that a constant pressure is maintained in the pressure vessel. Coating is supplied to the nozzle by causing a valve to open in response to commands issued from the controller. The difference in pressure between that inside the pressure vessel and atmospheric, will cause the coating solution to flow.

The curing station includes a cover carried by the mounting plate having an opening adapted to receive one of the lens support having one of the lenses mounted thereon. Means for curing the coating solution applied to the exposed lens surface, preferably in the form of an ultra-violet (UV) lamp, are positioned within the cover and can be selectively energized in response to commands issued from the controller. When the lamp is energized, UV radiation is directed onto the exposed lens surface solidifying the coating solution deposited thereon. While the lens is being exposed to the UV radiation, the lens support, in response to commands issued from the controller, causes the lens to rotate. In addition, gas, preferably nitrogen, is introduced into the cover during the curing process.

The present invention also resides in a method for applying a coating to a surface of at least one lens and preferably a pair of lenses, using the above described apparatus. Prior to initiating a coating operation, a lens is mounted onto each lens support such that one of the major lens surfaces is exposed. Next, the lenses are sequentially indexed relative to the mounting plate to position the first exposed lens surface adjacent to the washing station. Washing fluid is then deposited onto the lens and the lens rotated such that centrifugal force generated by the rotation expels any excess fluid from the lens surface, preparing the lens for application of a drying solution.

Subsequent to the washing operation, the lens supports are indexed to position the first exposed lens surface adjacent to the coating station and the second lens support adjacent to the washing station. Accordingly, a washing and coating operation are simultaneously performed. During a coating operation, at least one coating solution is deposited onto the exposed lens surface which is rotated to evenly spread the coating solution across the lens surface and expel any excess coating solution therefrom.

Once the coating operation is complete, the lens supports are indexed to position the first lens support adjacent to the curing station and the second lens support adjacent to the coating station. A coating and curing operation can then be accomplished at the same time. At the curing station, ultra-violet radiation is directed at the exposed lens surface of the lens carried by the first lens support thereby solidifying the coating solution on the lens.

DETAILED DESCRIPTION OF THE PREFERRED EMBODIMENT

Figure 1:
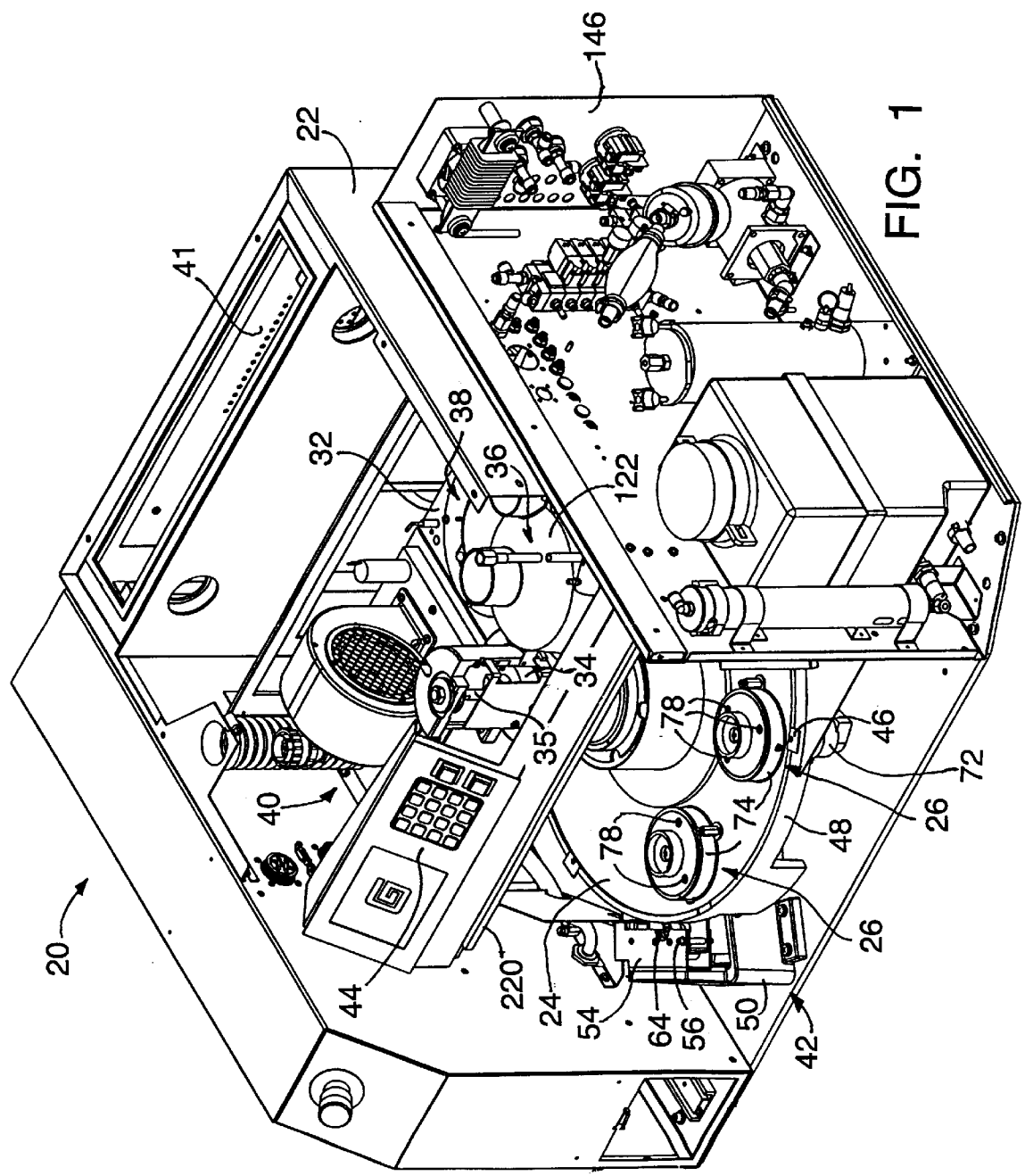
FIG. 1 is a partial perspective view of the apparatus of the present invention for coating a surface of one or more lenses showing portions of the apparatus cut away to reveal internal mechanisms.

As shown in FIG. 1, an apparatus for coating a surface of one or more lenses is generally designated by the reference numeral 20 and includes a frame 22, having a turntable 24 rotatably mounted thereon. Two lens supports 26 described in detail below are attached to the turntable 24. Each lens support 26 is adapted to carry a lens 28 such that a major surface 30 of the lens is exposed. A mounting plate 32 is coupled to the frame 22 approximately centrally of the turntable 24 via a pneumatic cylinder 34. The pneumatic cylinder 34 includes a rod 35 extending therefrom, and engaged with the mounting plate 32, the rod and thereby the mounting plate being moveable between an extended or non-working position and a retracted or working position. A plurality of work stations 36, 38, and 40 are carried by the mounting plate 32, each for performing a different work operation as explained in detail below, on the exposed lens surfaces 30. In addition, air is circulated laminarly between the turntable 24 and the mounting plate 32 to pressurize the apparatus minimizing the potential for foreign matter to be introduced therein. The air is drawn through filter 41, which is preferably of the HEPA type, and circulates through the apparatus.

Figure 2:
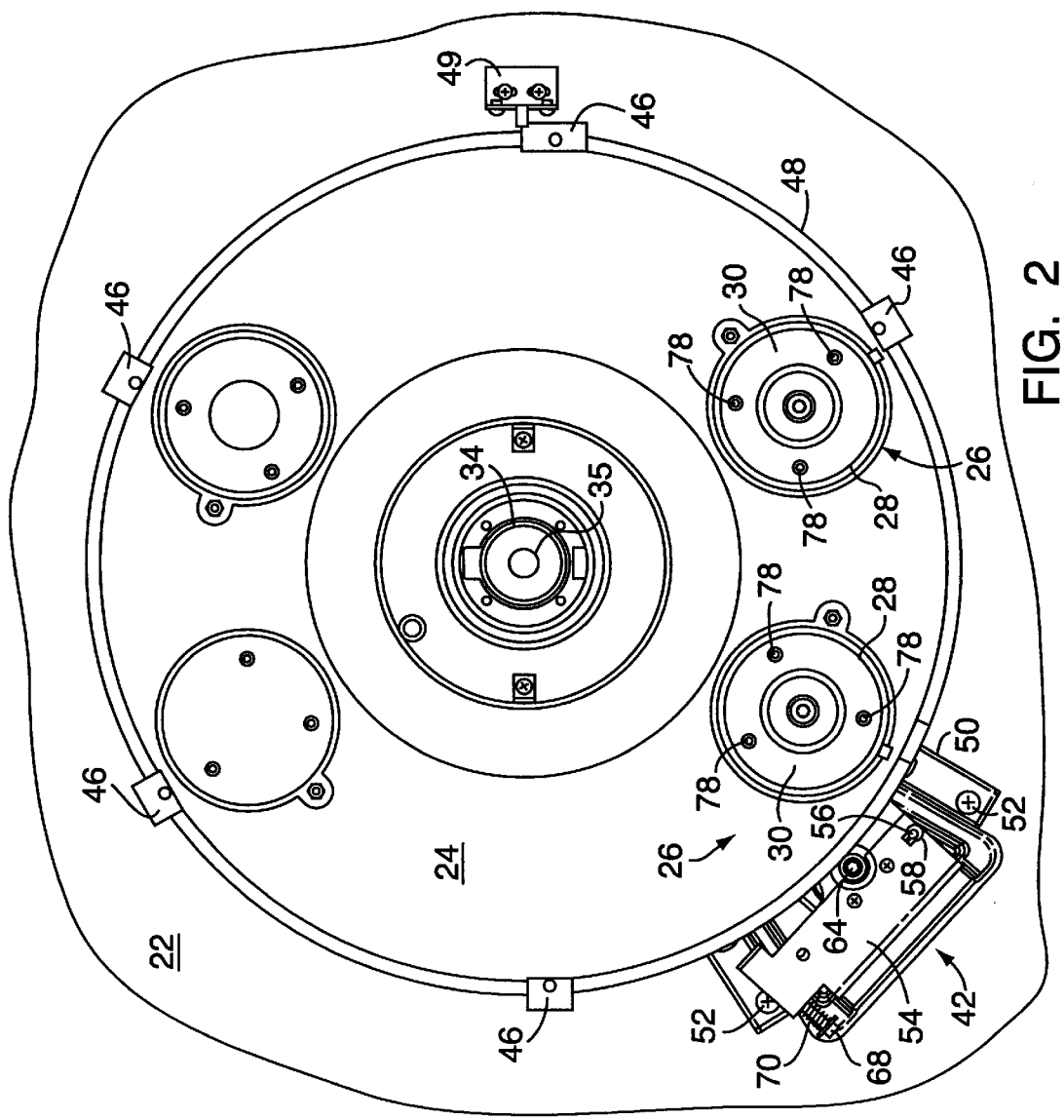
FIG. 2 is a plan view of a turntable and turntable drive of the apparatus of FIG. 1 showing a pair of lens supports mounted thereon.

As shown in FIG. 2, a drive mechanism generally designated by the number 42, and explained in detail below is mounted to the frame 22 adjacent to the turntable 24 for rotatably indexing the turntable in response to commands issued from a controller 44, FIG. 1, mounted on the frame. A plurality of tabs 46 are mounted on, and project radially from a peripheral surface 48 defined by the turntable 24. During operation, as the drive mechanism 42 indexes the turn table 24, the positions of the tabs 46 are detected by a sensor 49 mounted on the frame 22. The sensor 49 generates signals responsive to the detected tab positions that are received by the controller 44. The controller 44 interprets these signals and coordinates the motion of the turntable 24 accordingly.

Figure 3:
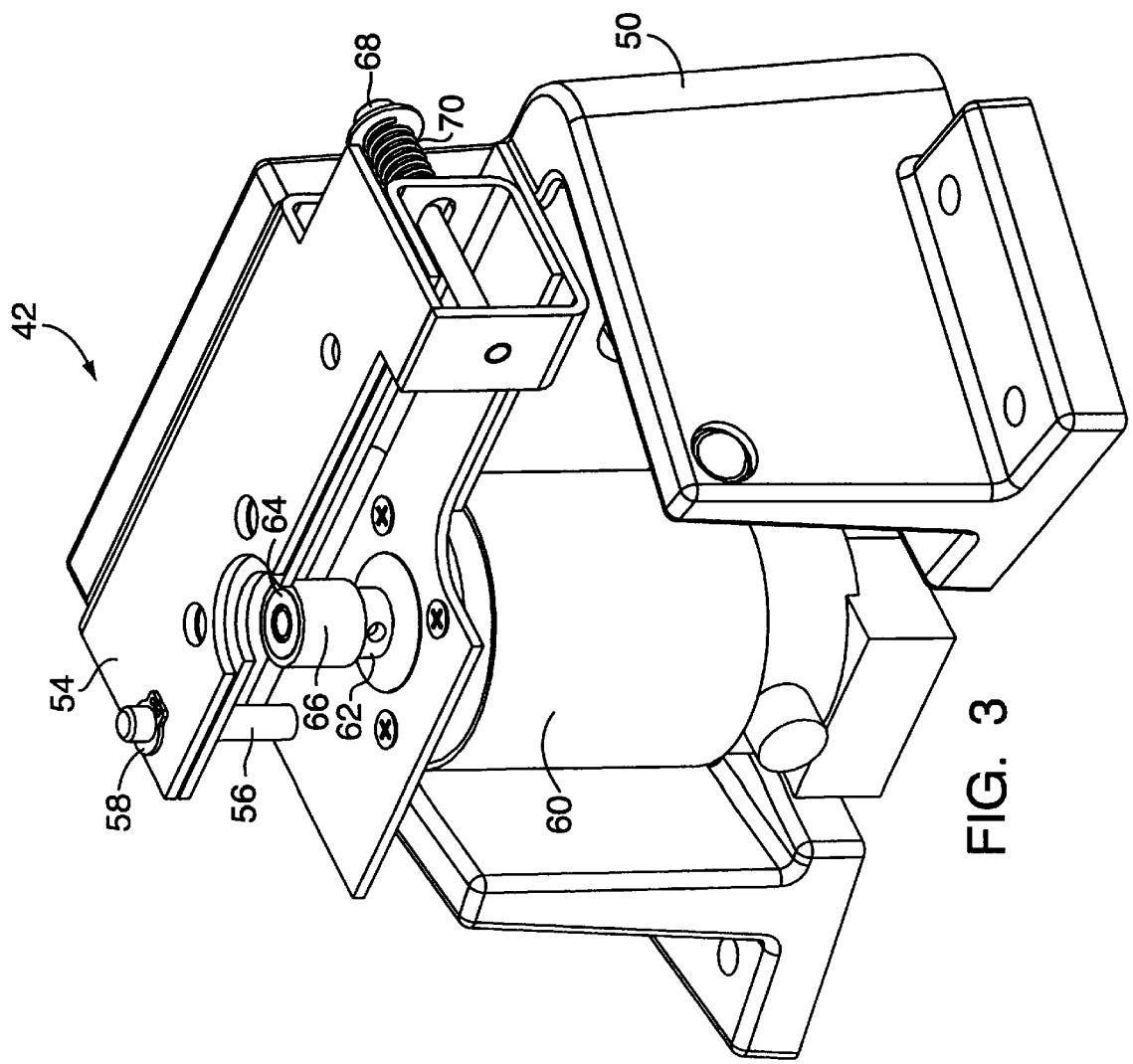
FIG. 3 is a perspective view of the turn table drive of FIG. 2.

As shown in FIGS. 2 and 3, the drive mechanism 42 includes a base 50 attached to the frame 22 via screws 52. A mounting bracket 54 is pivotally coupled to the base 50 via pin 56 and spring clip 58. A servo motor 60 having a rotatable shaft 62 extending therefrom is carried by the mounting bracket 54. A wheel 64 having a resilient peripheral surface 66 is mounted on the shaft 62 and engages the peripheral surface 48 defined by the turntable 24. The amount of pressure exerted by the resilient peripheral surface 66 of the wheel 64 against the peripheral surface 48 of the turntable 24 can be adjusted by turning the screw 68 which is threadably engaged with the base 50. A biasing member shown in the illustrated embodiment as a coil spring 70 extending over the screw 68 urges the mounting bracket 54 and thereby the wheel 64 toward or away from the peripheral surface 48 defined by the turntable 24.

Figure 4:
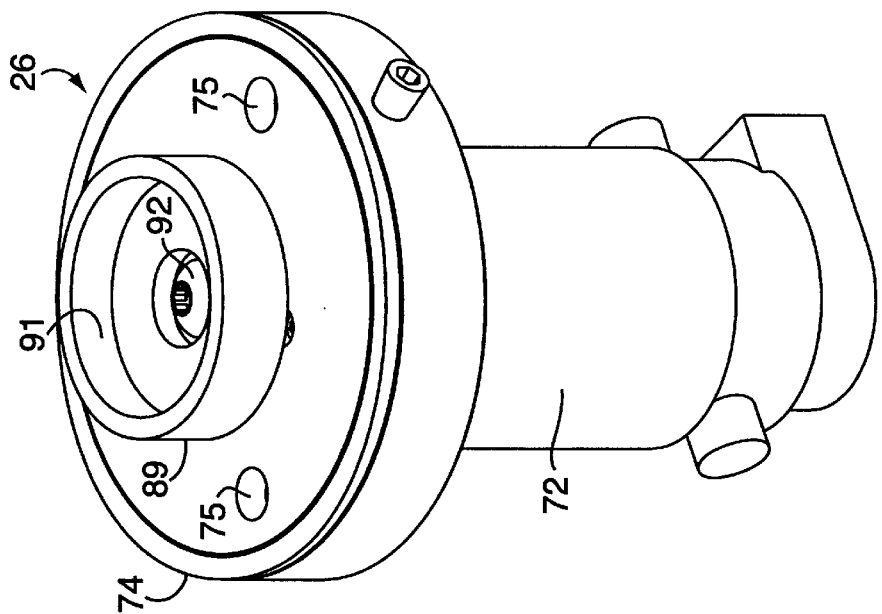
FIG. 4 is a perspective view of one of the lens supports of FIG. 2.
Figure 5:
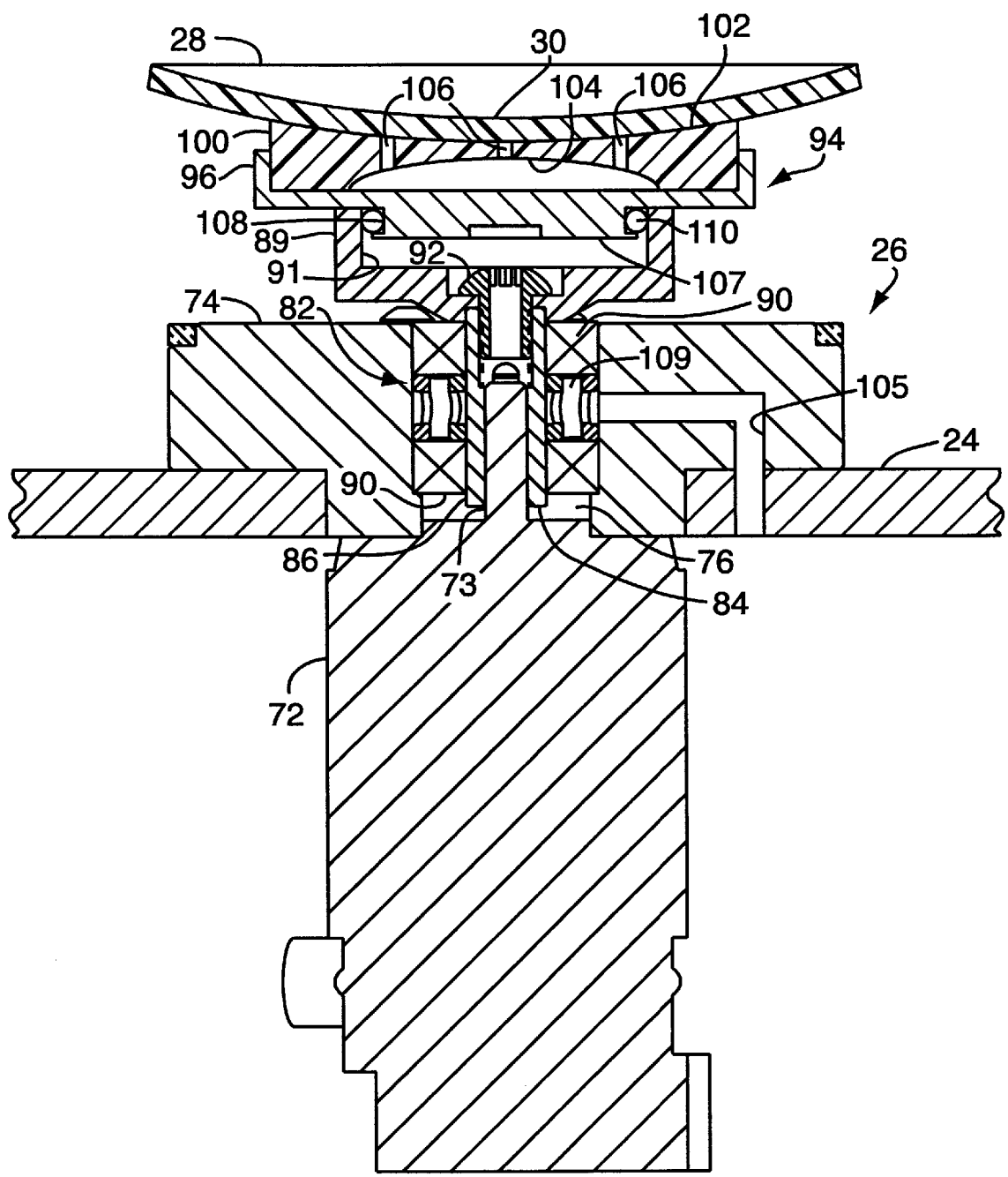
FIG. 5 is a cross sectional view of the lens support of FIG. 4.

As shown in FIGS. 4 and 5, the lens supports 26 each include a servo motor 72 having a rotatable shaft 73, best seen in FIG. 5, extending therefrom. A flange 74 is attached to the servo motor 72 and includes apertures 75 extending therethrough for receiving bolts 78 mounting the servo motor 72 to the turntable 24, FIG. 1. The flange 74 further includes a central bore 76 having a spacer 82 positioned therein. A hollow sleeve 84 is pressed onto the shaft 73 of the servo motor 72 and includes an outer peripheral surface 86 that engages two bearings 90 are also positioned in the bore 76, one above and one below the spacer 82. A receptacle 89 having an upwardly projecting recess 91 is mounted on the sleeve 84 via fastener 92.

Figure 6:
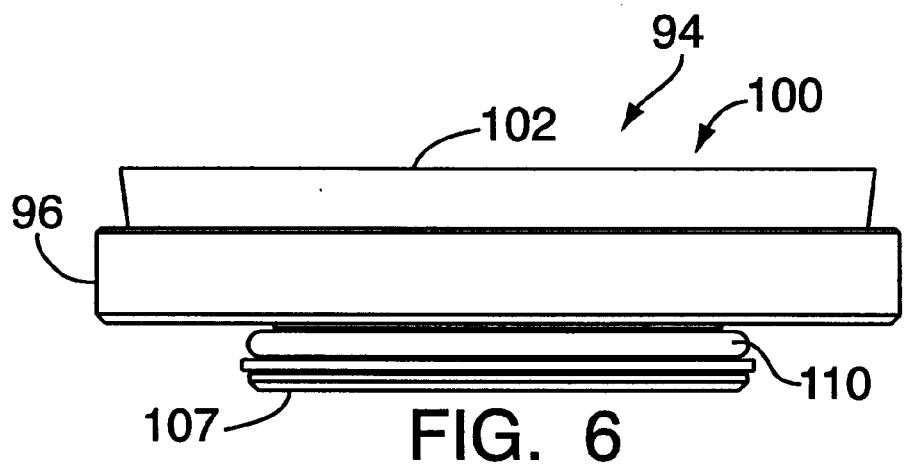
FIG. 6 is a front elevational view of a mounting adapter forming part of the lens support of FIGS. 4 and 5.
Figure 7:
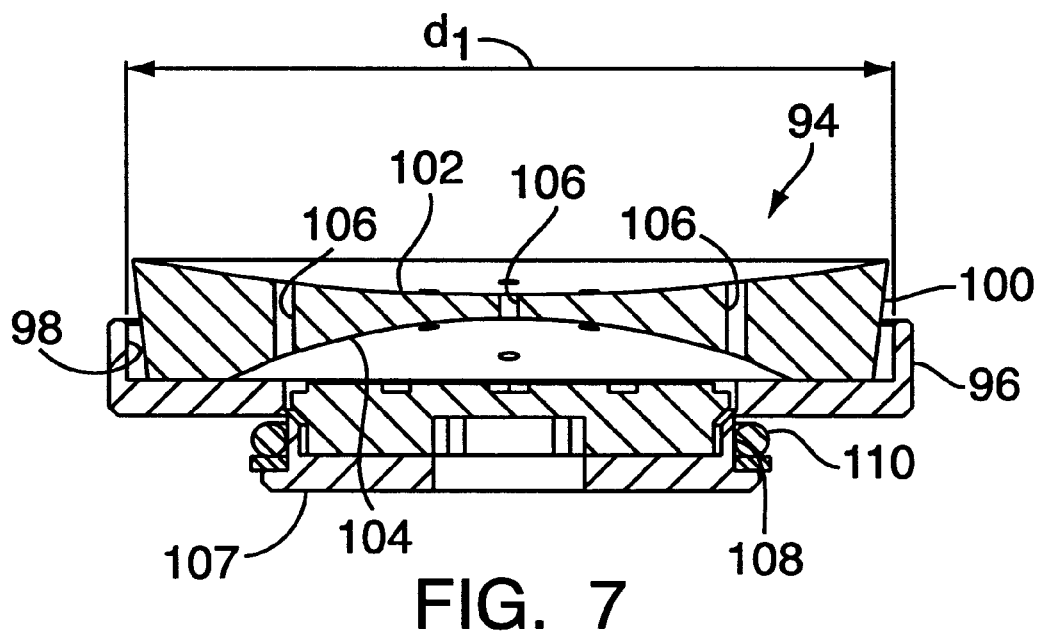
FIG. 7 is a cross sectional view of the mounting adapter of FIG. 6.

Referring to FIGS. 6 and 7, a mounting adapter generally designated by the reference numeral 94 includes an upper section 96 having a bore 98 extending part way therethrough and defining a first diameter labeled d1. A resilient support member 100 made from a suitable material such as, but not limited to silicone, is positioned in the bore 98. The resilient support member 100 includes an upper surface 102 contoured and complimentary to the shape of a lens 28 to support the lens thereon. The support member 100 also defines a contoured lower surface 104, and a plurality of perforations 106 extending through the support member. The perforations 106 are in gaseous communication with passage 105 defined by the flange 74 via gap 109 between the spacer 82.

Still referring to FIGS. 6 and 7, the mounting adapter 94 also includes a lower section 107 projecting downwardly from the upper section 96 and defining a groove 108 adapted to receive an O-ring 110. Referring back to FIG. 5, the lower section 107 of the mounting adapter 94 is of a shape complimentary to the recess 91 defined by the receptacle 89 and is receivable therein. The O-ring 110 frictionally engages the wall of the recess 91 thereby releasably retaining the mounting adapter to the lens support 26. The resilient support member 100 is shown in FIGS. 6 and 7 includes a contoured lower surface 104 for increasing the support members resiliency thereby allowing the support member to carry, and conform to the shape of different lenses.

Figure 8:
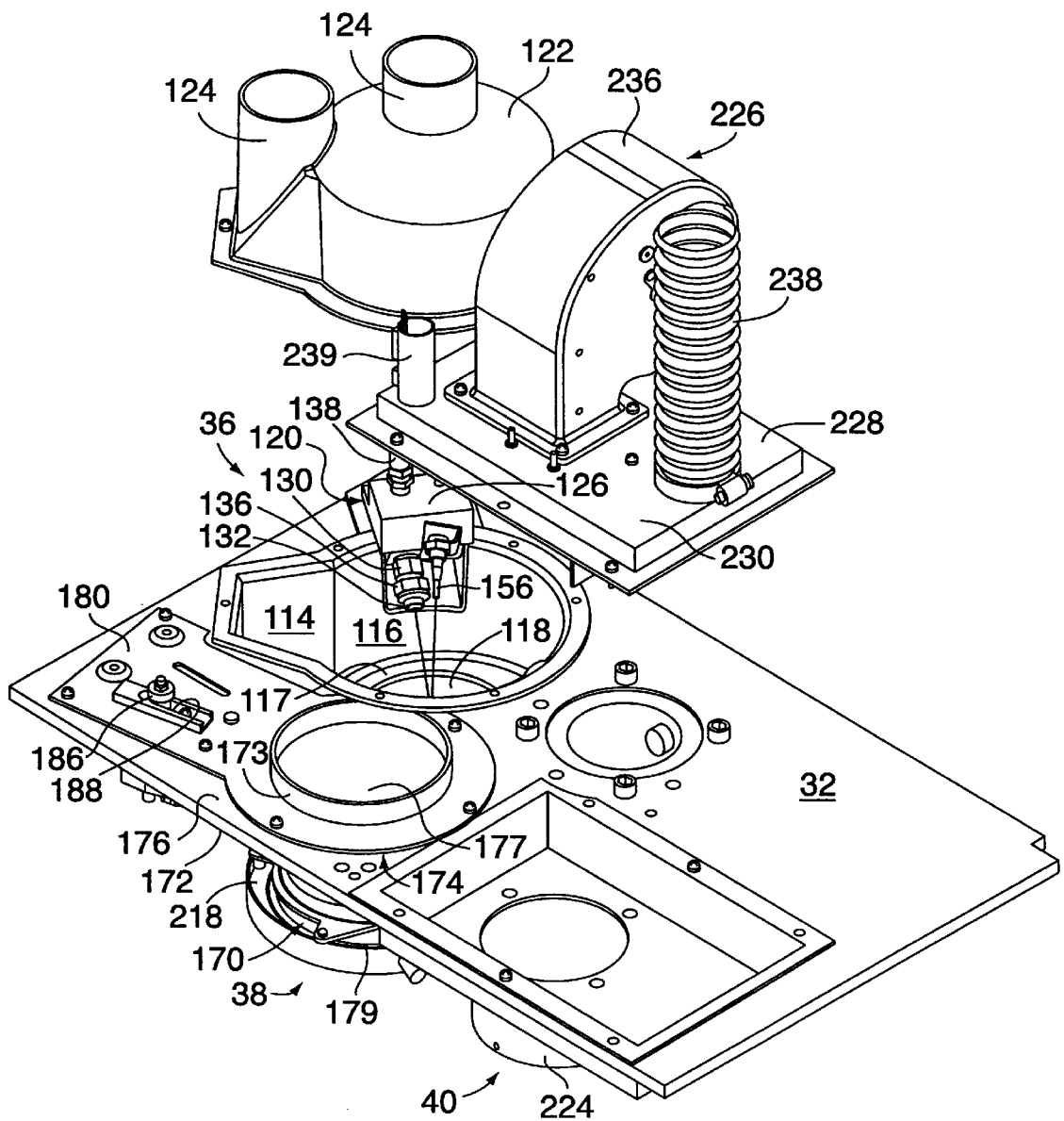
FIG. 8 is a perspective view from the rear of a mounting plate and plurality of work stations carried thereon employed in the apparatus of FIG. 1.

As shown in FIG. 8, the mounting plate 32 carries a plurality of work stations generally designated by the reference numerals 36, 38, and 40. The work station labeled 36 is a lens washing station that includes a wash cup 114 attached to the mounting plate and defining an interior area 116. The wash cup also includes an opening 118 in communication with the interior area and positioned adjacent to and adapted to receive one of the exposed lens surface 30 when one of the lens supports 26 is positioned proximate to the washing station. A nozzle assembly generally designated by the reference numeral 120 and explained in detail below, is located within the wash cup 114 for depositing washing and drying solution onto the exposed lens surface. In addition, a washing station cover 122 is mountable to the mounting plate directly over the wash cup 114. The washing station cover 122 includes a pair of exhaust ports 124 for drawing vapor generated during a washing operation, out of the wash cup where it is then filtered through a charcoal filter (not shown).

Figure 9:
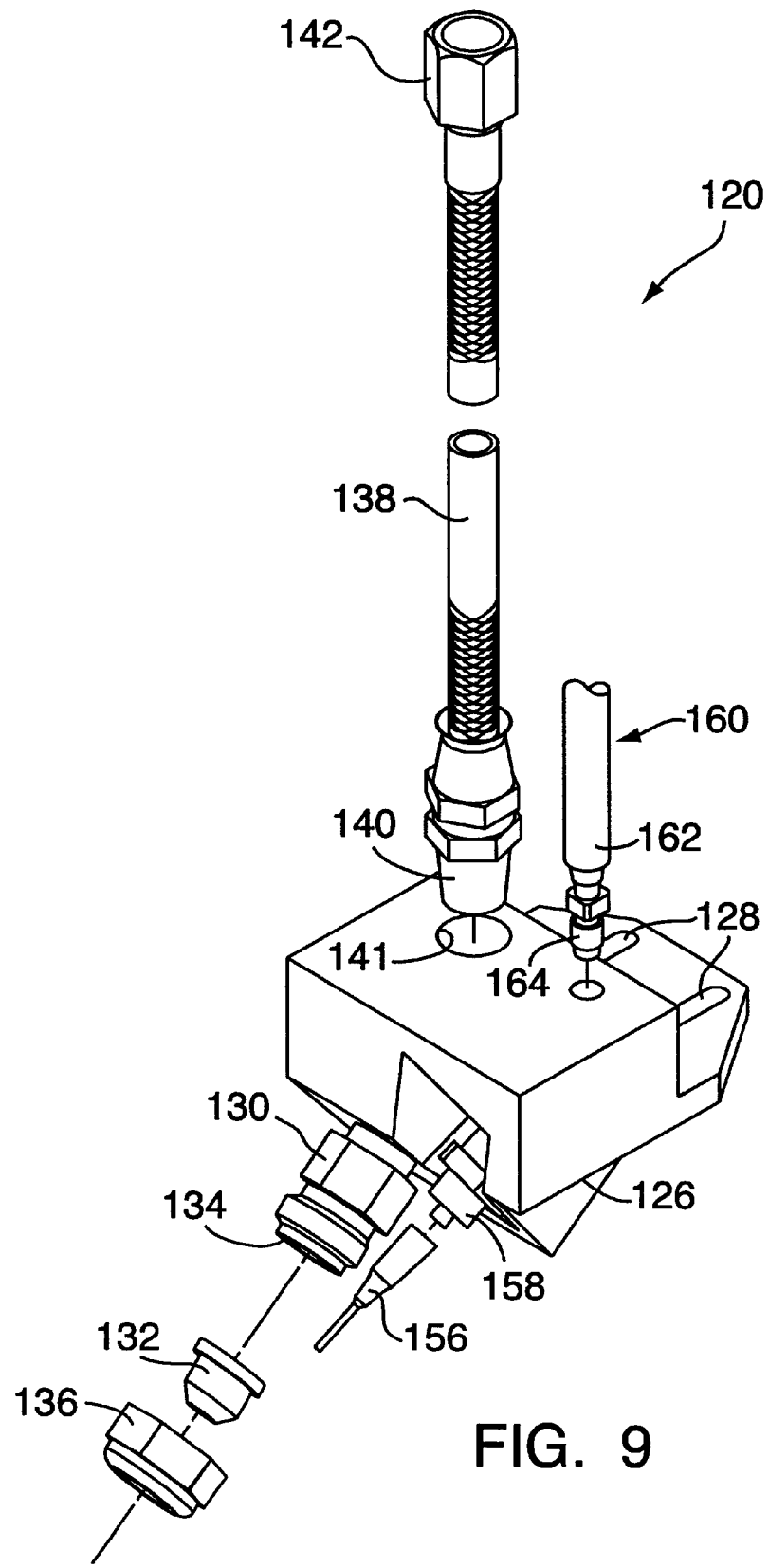
FIG. 9 is an exploded perspective view of a nozzle assembly for depositing a washing and drying solution onto a lens surface.

As shown in FIG. 9, the nozzle assembly 120 includes a distribution block 126 attachable to the mounting plate 32 via fasteners (not shown) which extend through slots 128 defined by the distribution block. A fitting 130 is threadably engaged with the distribution block 126 and a first nozzle 132 abuts an end 134 of the fitting. The first nozzle 132 is secured to the fitting 130 by cap 136 which extends over the first nozzle and threads onto the end of the fitting. Flexible conduit 138 includes a first end 140 threadably engaged in aperture 141 defined by the distribution block 126 and is in fluid communication with the nozzle 132 via an internal passage (not shown) in the distribution block. The flexible conduit 138 also includes a second end 142 shown for clarity in FIG. 9 in an uncoupled position. However, as will be explained in detail hereinafter, and with reference to FIG. 10, the second end 142 of the flexible conduit 138 is coupled to a pump 144.

Figure 10:
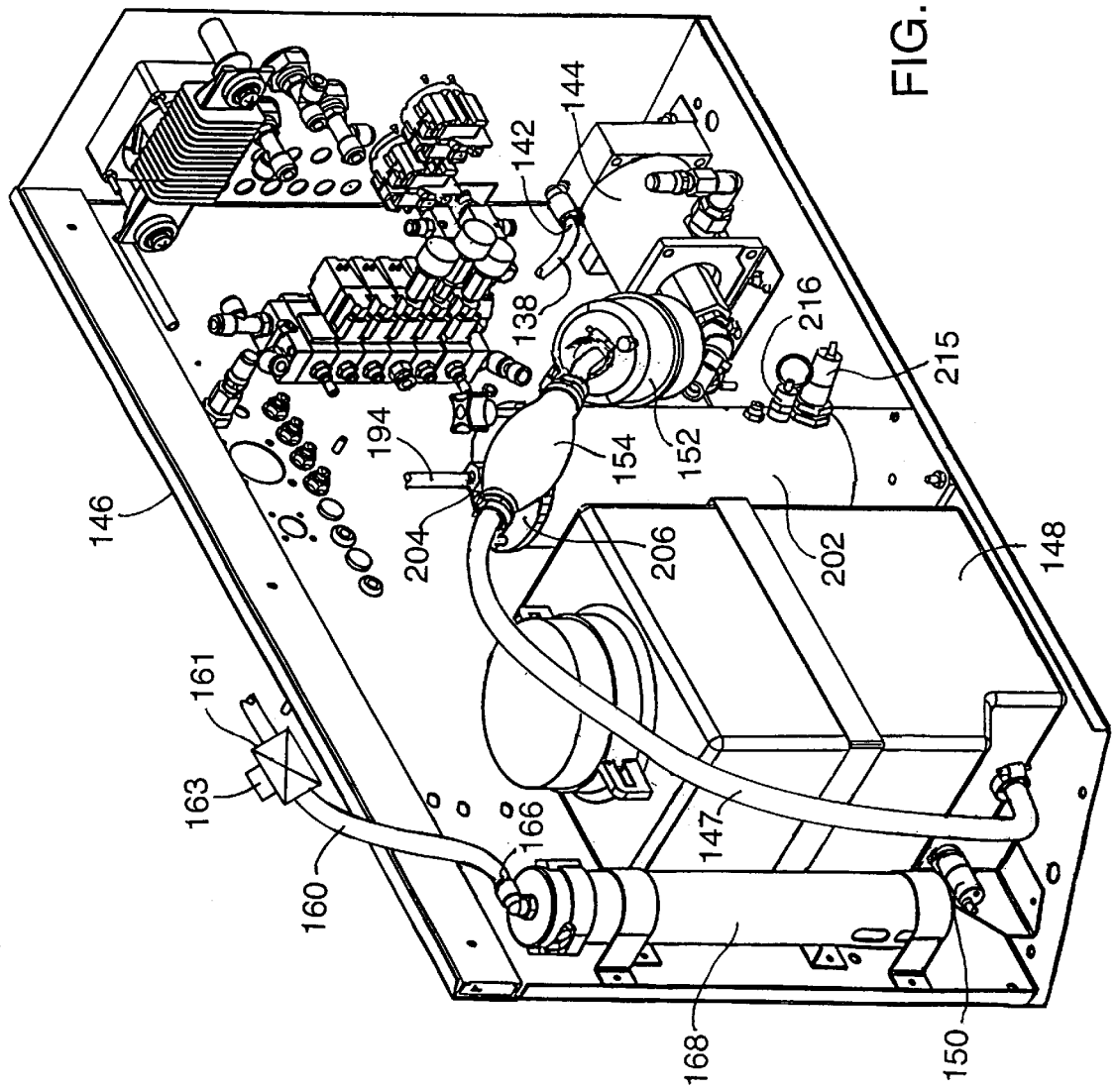
FIG. 10 is a partial perspective view of the apparatus of FIG. 1 showing the wash solution reservoir and pump, the coating solution reservoir, and the drying solution reservoir.

Referring to FIG. 10, and as stated above, the second end 142 of the conduit 138 is coupled to a pump 144 that in turn is mounted to a panel 146. The panel 146 is mountable on the frame 22 (not shown). The pump 144 is in fluid communication via flexible tubing 147 with wash fluid reservoir 148 which is also mounted to the panel 146. The wash fluid reservoir 148 is filled with a lens washing solution, such as, but not limited to deionized water and includes a low fluid level sensor 150 mounted thereon for detecting a low washing fluid level. The sensor 150 generates signals receivable by the controller 44, FIG. 1, responsive to the washing fluid level.

A filter 152 is interposed between and in fluid communication with the pump 144 and the wash fluid reservoir 148 for filtering the washing solution prior to its entering the pump. In addition a manually operable siphon bulb 154 is positioned between and in fluid communication with the wash fluid reservoir 148 and the filter 152. Prior to operating the pump 144, the siphon bulb 154 is squeezed, thereby drawing washing solution from the reservoir 148 and priming the pump 144. During a lens washing operation, the pump 144 is actuated via commands issued from the controller 44 for a known period of time, thereby causing washing solution to be delivered at a pressure of approximately 1500 PSI to the nozzle 132, FIG. 9, which then deposits the washing solution onto the exposed lens surface 30 while the lens 28 is being rotated by the lens support 26.

Referring back to FIG. 9, a second nozzle 156 is also coupled to the distribution block 126 via fitting 158. A drying solution conduit 160 is mounted at a first end 162 to the distribution block 126 via fitting 164, and is in fluid communication with the nozzle 156 via an internal passage (not shown) in the distribution block.

Referring back to FIG. 10, the conduit 160 is attached at a second end 166 to a drying solution reservoir 168 which in turn is mounted to panel 146. The drying solution reservoir 168 is pressurized and contains a quantity of drying solution therein. During a washing operation, subsequent to the washing fluid being deposited onto the exposed lens surface, the rotation of the lens 28 is stopped. A normally closed valve 161 is then actuated by a solenoid 163 located between the second nozzle 156 and the drying solution reservoir 168 response to commands issued from the controller 44 allowing the drying solution to be delivered to the second nozzle 156. The lens is once again rotated. The rotation of the lens 28 causes the drying solution to be expelled from the lens surface 30. The expelled material is collected in gutter 117 defined by the housing 116, where it then drains into a collection basin (not shown). In addition, the expulsion of the washing and drying solutions from the exposed lens surface 28 can generate vapor. Accordingly, exhaust ports 124 are positioned on the cover for allowing any vapor to be drawn therethrough.

Referring back to FIG. 8, a coating station generally designated by the reference numeral 38 is carried by the mounting plate 32 and includes a housing 170 attached to an underside 172 of the mounting plate and extending downwardly therefrom. A housing cover 174 is attached to an upper side 176 of the mounting plate 32 directly above the housing 170 and includes at least one exhaust port 173 for drawing any vapor generated during the coating process, out of the housing 170. The vapor is then filtered through a charcoal filter (not shown).

Figure 11:
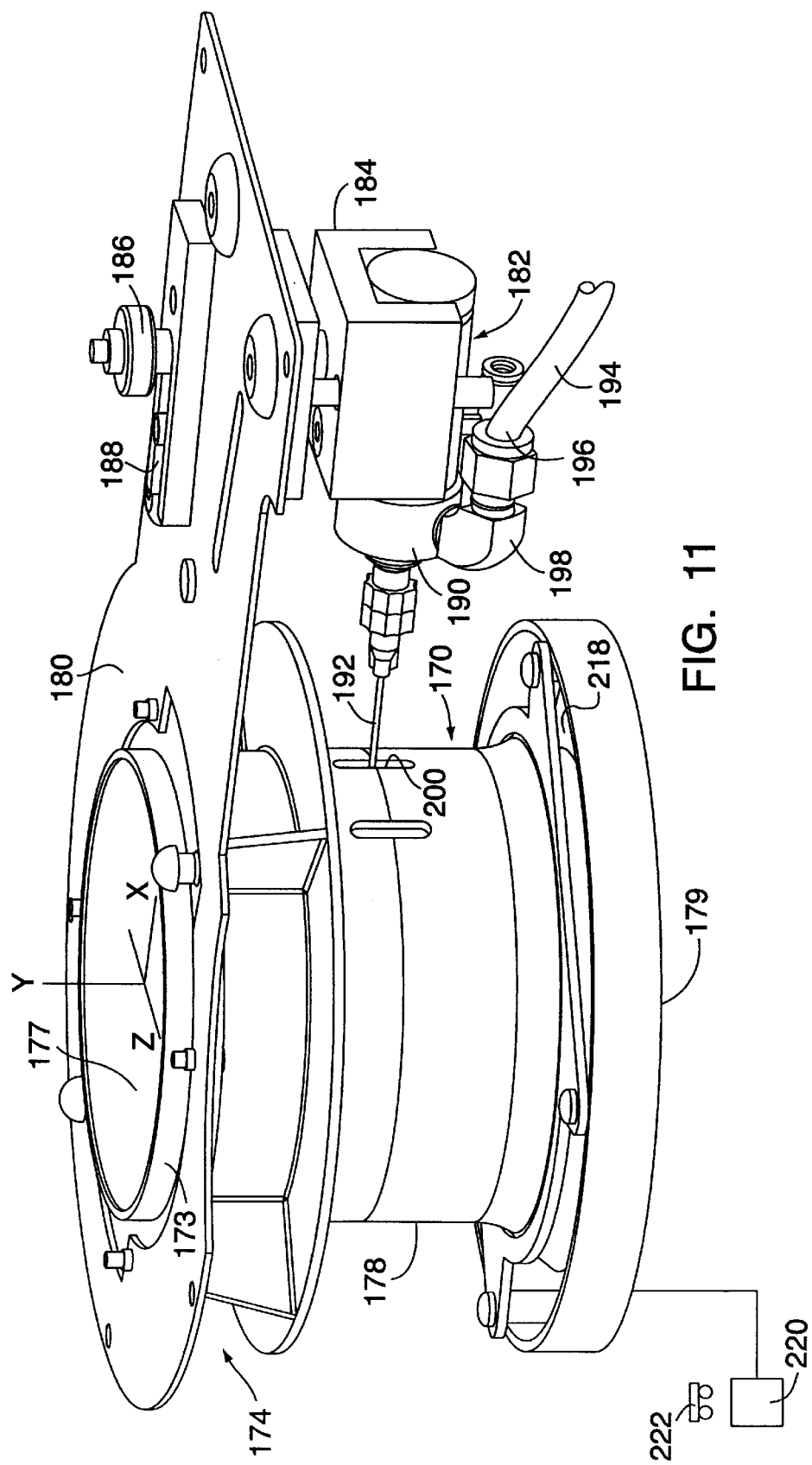
FIG. 11 is a partial perspective view of a coating station employed by the apparatus of FIG. 1 showing a nozzle for depositing a coating solution onto a lens surface.

As shown in FIG. 11, the housing 170 includes an interior area 177 defined by at least one housing wall 178. An opening 179 is provided in the housing 170 and is in communication with the interior area 177. The opening 179 is adjacent to one of the exposed lens surface 30 when one of the lens supports 26, FIG. 1 is positioned proximate to the coating station 38. The housing 170 also includes a mounting adapter 180 extending from an upper portion thereof and adapted to engage the mounting plate 32 thereby retaining the housing thereon. A nozzle assembly 182 includes a support bracket 184 adjustably coupled to the mounting adapter 180 via fastener 186 that extends through a slot 188 defined by the mounting adapter. A pneumatically actuated dispense valve 190 having an elongated nozzle 192 extending from an end thereof, is retained by the support bracket 184. A tube 194 includes a first end 196 coupled to the valve 190 via fitting 198. The nozzle 192 extends through a slot 200 defined by the housing wall 178 and into the interior area 177 of the housing. While the present invention has been shown and described as including a single nozzle assembly 182 for depositing a single coating solution, it is not limited in this regard as two or more nozzle assemblies for applying various different coatings, may be employed without departing from the broader aspects of the invention.

Figure 12:
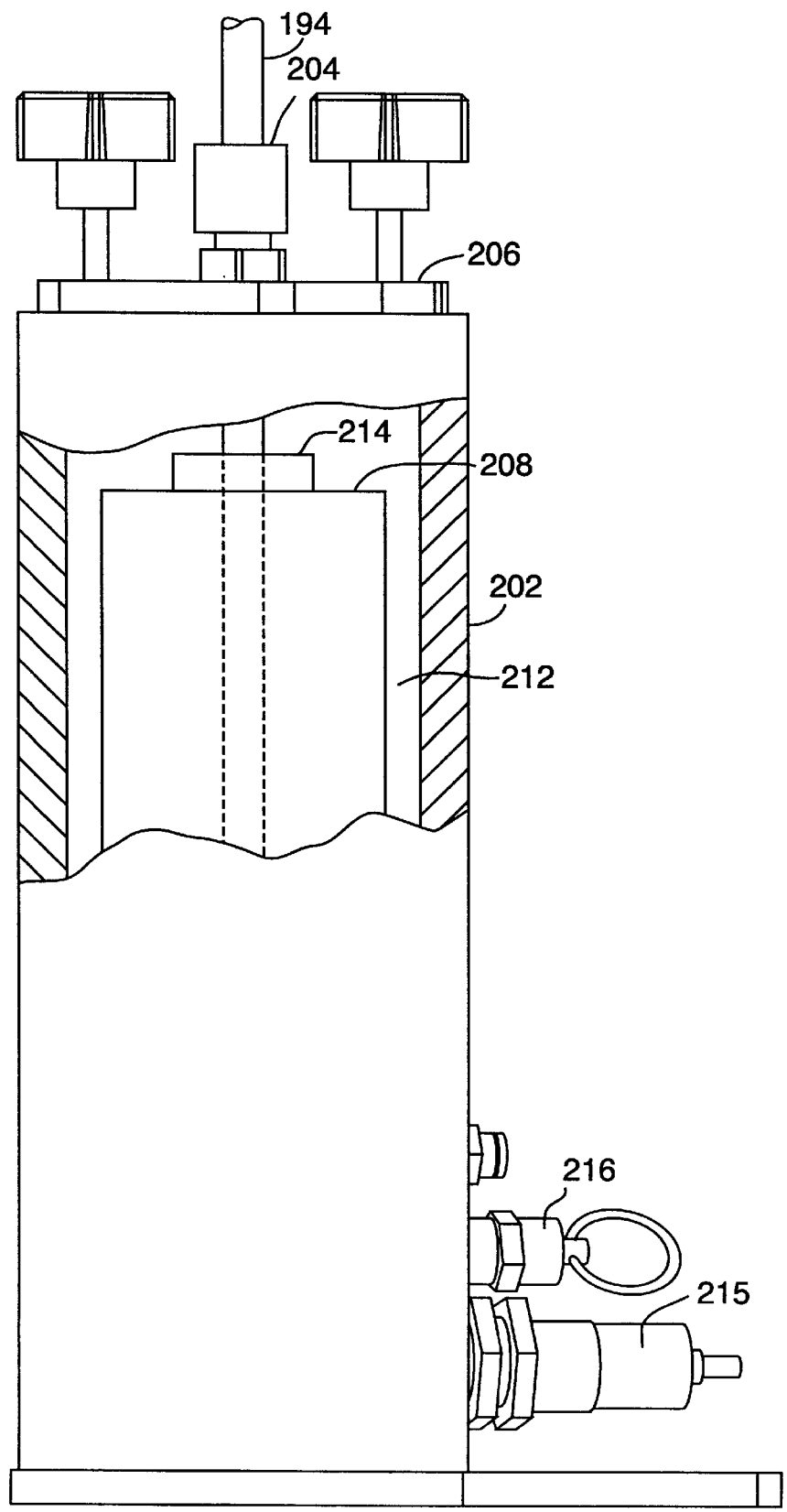
FIG. 12 is a partial cross-sectional view illustrating a coating solution reservoir positioned in a pressure vessel.

Referring back to FIG. 10, the tube 194 extends into pressure vessel 202 through a fitting 204 engaged with a top surface 206 of the pressure vessel. As shown in FIG. 12, a coating solution reservoir, illustrated as a container 208 positioned within an interior area 212 of the pressure vessel 202. The container 208 is filled with coating solution and includes a lid 214 threadedly coupled to the top of the container and through which extends the tube 194. During operation, and in response to commands issued from the controller 44, the pressure vessel 202 is pressurized such that the pressure inside the pressure vessel is greater than that outside the pressure vessel. Therefore, actuation of the dispense valve 190 in response to commands issued from the controller 44 will cause the coating material to flow from the higher pressure inside the pressure vessel, to the lower, atmospheric, pressure at the nozzle. The pressure vessel 202 also includes a sensor 215, FIG. 10, attached thereto for detecting the coating solution level in the resilient container 208. In addition a pressure relief valve 216 is also mounted on the pressure vessel 202 for venting the vessel to atmosphere. While a single pressure vessel 202, and container 208 have been shown and described, the present invention is not limited in this regard as multiple vessels and containers for applying different coating materials can be provided without departing from the broader aspects of the present invention.

Referring back to FIG. 11, the housing 170 includes a trough 218 positioned adjacent to the opening 179. During a coating operation, the coating solution is deposited onto the exposed lens surface 30 in the above-described manner. Depending on the lens geometry, as the coating solution is being applied the servo motor 72, FIG. 4, of the lens support 26 may cause the lens to rotate in response to commands issued from the controller 44, FIG. 1. This rotation imparts centrifugal force to the applied coating solution causing it to spread evenly over the exposed lens surface 30. Excess coating solution is thrown from the lens and collects in the trough 218. The collected coating solution drains from the trough 218 and collects in receptacle 220, shown schematically in FIG. 11. An ultraviolet light source 222 is positioned above the receptacle 220 and can be selectively energized in response to commands issued from the controller to cure and thereby solidify any excess coating solution. Preferably, the receptacle 220 is in the form of a drawer positioned in the frame 22 and movable between an open and closed position to allow an operator to remove and dispose of any cured coating solution contained therein. Alternatively, the collected coating material can be recycled for re-application onto a lens surface.

Referring back to FIG. 8, a curing station generally designated by the reference numeral 40 is carried by the mounting plate 32 and includes a cover 224 attached to the underside 172 of the mounting plate, the cover being adapted to receive one of the lens supports 26, FIG. 4. A lamp assembly generally designated by the reference numeral 226 is mounted on the upper surface 176 of the mounting plate 32.

Figure 13:
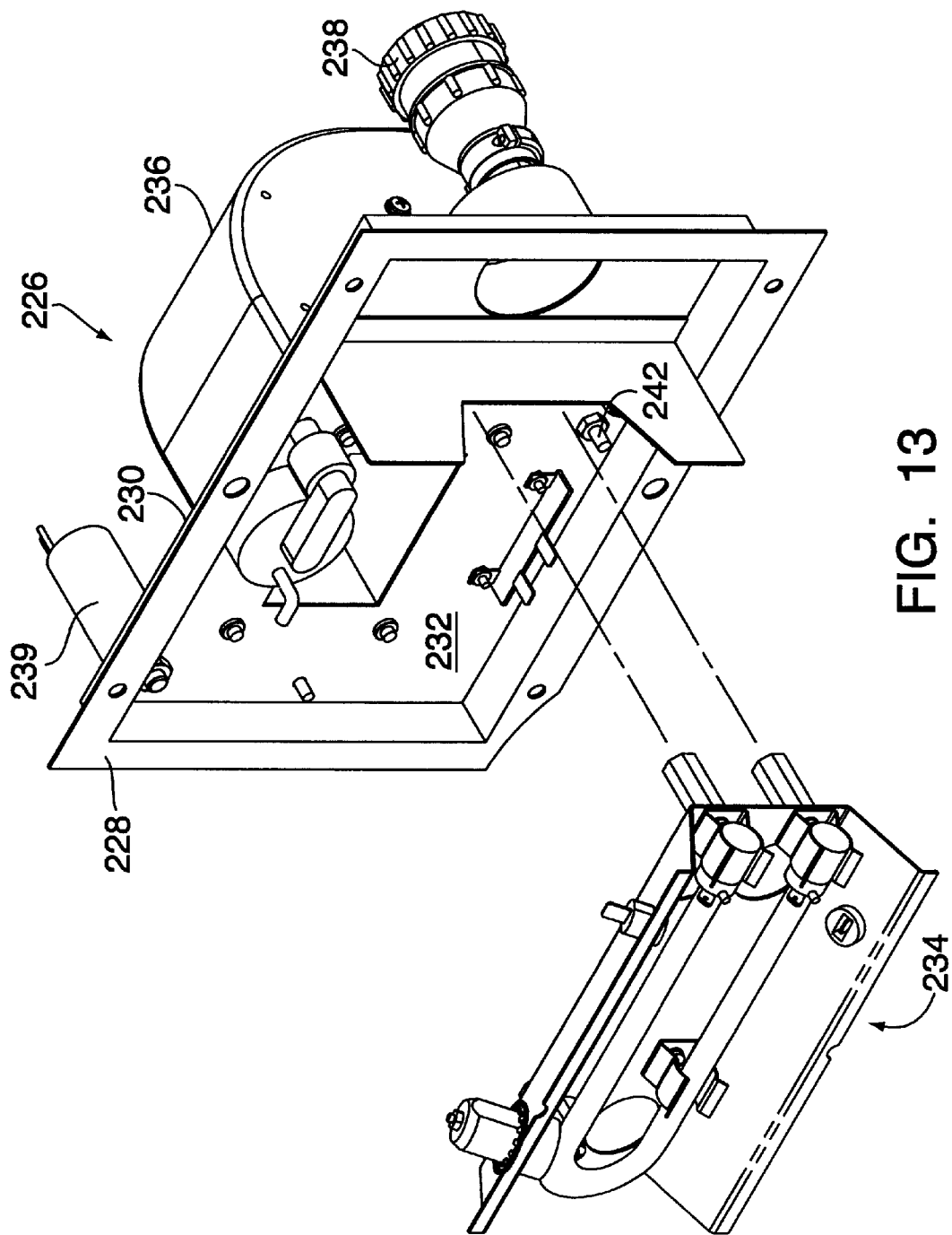
FIG. 13 is a perspective view of a curing lamp and blower for cooling the lamp, utilized in a curing station that comprises one of the plurality of work station of FIG. 8.

As shown in FIG. 13, the lamp assembly 226 includes a cover plate 228 defining a first chamber and including an upper and lower surface, 230 and 232 respectively. An ultraviolet lamp 234 is mounted to the lower surface 232, and a blower 236 is mounted to the upper surface 230 above the lamp, a quartz window (not shown) separates the first chamber from the interior area of the housing 224. The blower 236 is constantly operated and cools the ultraviolet lamp 234. Conduits 238 is also attached to the upper surface 230 over an opening defined therein, for exhausting the air circulated by the blower 236. During the curing operation, the housing 224 is flooded with a gas, preferably nitrogen, from a source not shown, through fitting 242.

Referring to FIGS. 1–13 a coating operation is performed using the apparatus 20 of the present invention, by first ensuring that the mounting plate 32 is in the non-working position, and then loading a pair of lenses 28 onto the resilient support pads 100 of each lens support. Vacuum is drawn through the perforations 106 defined by the support pad 100 to releasably retain a lens on each of the lens supports 26. In addition, the apparatus, particularly between the turntable 24 and the mounting plate 32 is pressurized as described above. The turntable drive mechanism 42 indexes the first lens support 26 in response to commands issued from the controller 44, until the lens support is adjacent to the wash station 36. The pneumatic cylinder 34 is then actuated to lower the mounting plate 32 into the working position such that the lens support 26 is located within the interior area 116 of the wash cup 114. The lens 28 is then spun by the servo motor 72 as washing solution is fed from the reservoir 148 to the first nozzle 132 by the pump 144, and deposited on the exposed lens surface 30. Subsequent to the application of the washing solution, the rotation of the lens is stopped and the controller 44 issues commands to the solenoid 163 to open the valve 161 and allow drying solution to be fed from the pressurized reservoir to the second nozzle 132 where it is deposited onto the exposed lens surface 30. The lens is then spun again. During the washing operation, any vapor generated is drawn from the wash cup 114, and material expelled from the lens is collected in gutter 117 in the above-described manner.

Upon completion of the washing operation, mounting plate 32 is moved via pneumatic cylinder 34 to the non-working position. Next, the drive mechanism 42 indexes the first lens support 26 to the coating station 38, and the second lens support 26 to the washing station 36. The mounting plate 32 is once again lowered to the working position, such that the first lens support is located within the interior area 177 of the coating station housing 170, and the second lens support is positioned within the wash cup 114. In response to commands issued from the controller 44, a coating operation is performed as described above on the first lens 28 mounted on the first lens support, while a washing operation as described above is simultaneously performed on the second lens supported by the second lens support.

After the coating and washing operations are completed on the first and second lenses, the mounting plate 32 is again raised to the non-working position. The controller 44 then coordinates the motion of the turntable 24 indexing the first lens support 26 to the curing station 40 and the second lens support to the coating station. The mounting plate 32 is then moved to the working position causing the first lens to be located within the curing station cover 224, and the second lens to be positioned in the coating station housing 170. A curing and coating operation are then simultaneously performed on the first and second lenses in response to commands issued from the controller.

During the curing operation, the lens 28 is spun by the lens support 26 and the cover 224 is flooded with nitrogen to minimize the oxygen content in the cover. In addition the ultraviolet lamp 234 is energized exposing the coating material on the exposed lens surface to radiation that causes the material to cure. The blower 236 operates constantly to cool the ultraviolet lamp.

Upon completion of the curing operation on the first lens, and the coating operation on the second lens, the mounting plate 32 is moved to the non-working position, via the pneumatic cylinder 34. The drive mechanism 42 then indexes the turntable 24 to move the second lens support 26 to the curing station, and the first lens support to a position where the washed, coated, and cured lens can be removed from the apparatus.

While preferred embodiments have been shown and described, various modifications and substitutions may be made without departing from the spirit and scope of the present invention. Accordingly, it is to be understood that the present invention has been described by way of example, and not by limitation.

What is claimed is:

1. An apparatus for coating a surface of at least one lens having pair of opposed major surfaces, said apparatus comprising:

a frame;

at least one lens support coupled to said frame;

mounting means for releasably retaining at least one lens on said lens support with one of said major surfaces exposed;

a mounting plate coupled to said frame and positioned proximate to said lens support;

a series of work stations carried by said mounting plate, for sequentially performing work operations on said exposed major surface of said lens;

indexing means for effecting relative motion between said mounting plate and said lens support, to position said exposed lens surface adjacent to each of said work stations, thereby facilitating the performance of said work operations on said exposed lens surface;

a controller coupled to said apparatus for coordinating said work operations in response to lens coating data stored therein; and means for moving said mounting plate relative to said frame for positioning each of said plurality of work stations proximate to said exposed lens surface.

2. An apparatus for coating a surface of at least one lens as defined by claim 1, wherein:

said series of work stations includes a coating station for applying a lens coating solution onto said exposed lens surface.

3. An apparatus for coating a surface of at least one lens as defined by claim 1, wherein:

said plurality of work stations includes a curing station for solidifying said coating solution subsequent to the application of said coating solution onto said exposed lens surface.

4. An apparatus for coating a surface of at least one lens as defined by claim 1, wherein:

said lens support is mounted to said indexing means and includes drive means coupled thereto;

a mounting adapter rotatably coupled to said drive means and having a bore extending at least part-way therethrough;

a resilient support member for carrying said lens, having a plurality of perforations extending therethrough said support member being adapted to be received in said bore; and means for drawing vacuum through said perforations in said support member for releasably retaining said lens on said lens support.

5. An apparatus for coating a surface of at least one lens as defined by claim 4, wherein said drive means is a servo motor for rotating said lens in response to commands issued from said controller.

6. An apparatus for coating a surface of at least one lens as defined by claim 4, wherein resilient support member is formed from silicone.

7. An apparatus for coating a surface at least one lens as defined by claim 1, wherein:

said indexing means includes a turntable for carrying said at least one lens support, said turntable being rotatably mounted to said frame adjacent to said mounting plate; and turntable drive means for indexing said turntable adjacent to each of said plurality of work stations.

8. An apparatus for coating a surface of at least one lens as defined by claim 7, wherein:

said turntable defines a peripheral surface;

said drive means includes a resilient wheel rotatably engaged with said peripheral surface, said resilient wheel being coupled to a servo motor responsive to commands issued from said controller.

9. An apparatus for coating a surface of at least one lens as defined by claim 7, further comprising:

a plurality of tabs positioned about and extending from a peripheral surface defined by said turntable;

at least one sensor coupled to said frame adjacent to said peripheral surface for detecting the position of said tabs relative thereto, and for generating signals responsive to said tab positions; and wherein said controller receives said signals and issues commands to said turntable drive means to index said lens support adjacent to each of said plurality of work stations.

10. An apparatus for coating a surface of at least one lens as defined by claim 1, wherein:

said mounting plate is positioned above said lens support; and said means for moving said mounting plate includes a pneumatic cylinder coupled at one to said frame and at an opposite end to said mounting plate;

said pneumatic cylinder defining a rod moveable between an extended position wherein said mounting plate and thereby said plurality of work stations are located above said lens support in a non-working position; and a retracted position wherein at least one of said plurality of work stations is in a working position adjacent to said lens support.

11. An apparatus for coating a surface of at least one lens having pair of opposed major surfaces, said apparatus comprising:

a frame;

at least one lens support coupled to said frame;

mounting means for releasably retaining at least one lens on said lens support with one of said major surfaces exposed;

a mounting plate coupled to said frame and positioned proximate to said lens support;

a series of work stations carried by said mounting plate, for sequentially performing work operations on said exposed major surface of said lens;

indexing means for effecting relative motion between said mounting plate and said lens support, to position said exposed lens surface adjacent to each of said work stations, thereby facilitating the performance of said work operations on said exposed lens surface;

a controller coupled to said apparatus for coordinating said work operations in response to lens coating data stored therein;

said series of work stations including a coating station for applying a lens coating solution onto said exposed lens surface, wherein said coating station includes:

a housing carried by said mounting plate, said housing having, an interior area defined by at least one housing wall, an opening in communication with said interior area, said opening being adjacent to said exposed lens surface when said lens support is positioned proximate to said coating station;

applicator means for depositing a known quantity of at least one lens coating solution onto said exposed lens surface in response to commands issued from said controller; and means for moving said housing relative to said mounting means so as to position said lens within said interior area during deposition of said lens coating solution onto said exposed lens surface.

12. An apparatus for coating a surface of at least one lens as defined by claim 11, wherein said applicator means includes:

at least one nozzle extending through said housing wall into said interior area, said nozzle being coupled to said mounting plate for movement relative to said exposed lens surface during deposition of said coating solution; and means for supplying a known quantity of said lens coating solution to said nozzle in response to commands issued from said controller.

13. An apparatus for coating a surface of at least one lens as defined by claim 12, wherein said means for supplying a known quantity of said lens coating solution to said nozzle includes:

at least one reservoir defining an interior area containing said coating solution therein;

at least one conduit in fluid communication at a first end with said interior area of said reservoir, and connected to said nozzle at a second end; and means for pressurizing said coating solution in said reservoir in response to commands issued from said controller, thereby causing a known quantity of said coating solution to flow through said conduit to said nozzle and onto said exposed lens surface.

14. An apparatus for coating a surface of at least one lens as defined by claim 13, wherein:

said reservoir is a container;

said means for pressurizing said coating solution includes a pressure vessel defining an interior area adapted receive said container;

said first end of said conduit extends through said pressure vessel and said container is immersed in said coating solution;

means for pressurizing said interior area of said pressure vessel such that a pressure differential is created between said coating solution in said container, and atmosphere in pressure; and a valve positioned between said pressure vessel and said nozzle for allowing said coating solution to flow from higher to lower pressure upon actuation of said valve.

15. An apparatus for coating a surface at least one lens as defined by claim 14, wherein:

means for venting said pressure vessel to release said gas from pressure vessel interior area.

16. An apparatus for coating a surface of at least one lens as defined by claim 12, wherein:

said lens support is rotatable relative to said housing in response to commands issued from said controller such that once said coating solution is deposited on said exposed lens surface, centrifugal force imparted by the rotation of said lens support causes said coating solution to spread completely over said exposed lens surface; and wherein said housing includes a trough adjacent to said opening for retaining any of said coating solution thrown from said lens during rotation of said lens support.

17. An apparatus for coating a surface of at least one lens as defined by claim 16, wherein:

said trough defines a drain;

said apparatus includes a receptacle in fluid communication with said drain for collecting said coating solution drained from said trough; and curing means for solidifying said coating solution in said receptacle in response to commands issued from said controller.

18. An apparatus for coating a surface of at least one lens as defined by claim 17, wherein:

said receptacle is a drawer mounted on said apparatus movable between an open and closed position; and said curing means includes an ultra-violet light source positioned above said drawer for exposing said coating solution located therein to ultra violet radiation when said drawer is in said closed position.

19. An apparatus for coating a surface of at least one lens as defined by claim 1, wherein:

said series of work stations includes a washing station for cleaning said exposed lens surface.

20. An apparatus for coating a surface of at least one lens having pair of opposed major surfaces, said apparatus comprising:

a frame;

at least one lens support coupled to said frame;

mounting means for releasably retaining at least one lens on said lens support with one of said major surfaces exposed;

a mounting plate coupled to said frame and positioned proximate to said lens support;

a series of work stations carried by said mounting plate, for sequentially performing work operations on said exposed major surface of said lens;

indexing means for effecting relative motion between said mounting plate and said lens support, to position said exposed lens surface adjacent to each of said work stations, thereby facilitating the performance of said work operations on said exposed lens surface;

a controller coupled to said apparatus for coordinating said work operations in response to lens coating data stored therein;

said series of work stations including a washing station for cleaning said exposed lens surface, wherein said washing station includes:

a wash cup having an opening adjacent to said exposed lens surface when said lens support is positioned proximate to said washing station;

means for moving said wash cup relative to said lens support so as to position said wash cup over said exposed lens surface during a washing operation; and means for depositing a washing fluid onto said exposed lens surface, and means for drying said exposed lens surface subsequent to said washing fluid being deposited thereon.

21. An apparatus for coating a surface of at least one lens as defined by claim 20, wherein:

said means for depositing said washing fluid onto said exposed lens surface includes at least one first nozzle positioned in said wash cup adjacent to said exposed lens surface, said nozzle being in fluid communication with a wash reservoir containing washing fluid therein; said wash station further including a pump positioned between and fluidly coupled to each of said nozzle and said reservoir for pressurizing said washing fluid in response to commands issued from said controller; and said means for drying includes a second nozzle positioned in said wash cup adjacent to said exposed lens surface, said second nozzle being in fluid communication with a drying reservoir containing drying solution therein for application to said exposed lens surface subsequent to supplying said washing fluid.

22. An apparatus for coating a surface of at least one lens as defined by claim 21, wherein:

said lens support is rotatable relative to said wash cup in response to commands issued from said controller such that once said washing fluid is deposited onto said exposed lens surface, centrifugal force imparted by the rotation of said lens support causes said washing fluid to be thrown from said exposed lens surface.

23. An apparatus for coating a surface of at least one lens as defined by claim 21, wherein:

said first and second nozzles are slidable relative to said wash cup to orient said nozzles relative to said exposed lens surface.

24. An apparatus for coating a surface of at least one lens as defined by claim 21, wherein:

said wash station further includes a siphon positioned between and fluidly coupled to said wash reservoir and said pump for priming said pump.

25. An apparatus for coating a surface of at least one lens having pair of opposed major surfaces, said apparatus comprising:

a frame;

at least one lens support coupled to said frame;

mounting means for releasably retaining at least one lens on said lens support with one of said major surfaces exposed;

a mounting plate coupled to said frame and positioned proximate to said lens support;

a series of work stations carried by said mounting plate, for sequentially performing work operations on said exposed major surface of said lens;

indexing means for effecting relative motion between said mounting plate and said lens support, to position said exposed lens surface adjacent to each of said work stations, thereby facilitating the performance of said work operations on said exposed lens surface;

a controller coupled to said apparatus for coordinating said work operations in response to lens coating data stored therein;

said plurality of work stations including a curing station for solidifying said coating solution subsequent to the application of said coating solution onto said exposed lens surface, wherein said curing station includes:
    a cover mounted to said mounting plate, said cover having an opening adjacent to said exposed lens surface when said lens support is positioned proximate to said curing station;
    means for moving said cover relative to said lens support so as to position said cover over said exposed lens surface during a curing operation; and
    means for curing said coating solution onto said exposed lens surface, in response to commands issued from said controller.

26. An apparatus for coating a surface of at least one lens as defined by claim 25, wherein:
    said means for curing includes an ultra-violet light source positioned within said cover and adjacent to said exposed lens surface for directing ultra violet radiation against said lens surface, thereby solidifying said coating solution.

27. An apparatus for coating a surface of at least one lens as defined by claim 26, wherein:
    said curing station includes means for introducing a gas into said cover during said curing operation.

28. An apparatus for coating a surface of at least one lens having pair of opposed major surfaces, said apparatus comprising:
    a frame;
    at least one lens support coupled to said frame;
    mounting means for releasably retaining at least one lens on said lens support with one of said major surfaces exposed;
    a mounting plate coupled to said frame and positioned proximate to said lens support;
    a series of work stations carried by said mounting plate, for sequentially performing work operations on said exposed major surface of said lens;
    indexing means for effecting relative motion between said mounting plate and said lens support, to position said exposed lens surface adjacent to each of said work stations, thereby facilitating the performance of said work operations on said exposed lens surface, said lens support is mounted to said indexing means and includes drive means coupled thereto for rotating said lens in response to commands issued from said controller;
    a controller coupled to said apparatus for coordinating said work operations in response to lens coating data stored therein;
    a mounting adapter rotatable coupled to said drive means and having a bore extending at least part-way therethrough;
    a resilient support member for carrying said lens, having a plurality of perforations extending therethrough said support member being adapted to be received in said bore; and
    means for drawing vacuum through said perforations in said support member for releasably retaining said lens on said lens support;
    said resilient support member defining a contoured upper surface of a shape complimentary to the contour of a lens to be supported thereon; said lens support further comprising a flange mounted to said servo motor and adapted to be coupled to said indexing means; and wherein
    said means for drawing vacuum through said perforations in said support member includes a passage defined by said flange and in gaseous communication with said perforations in said resilient support member.

29. An apparatus for coating a surface of at least one lens having pair of opposed major surfaces, said apparatus comprising:
    a frame;
    at least one lens support coupled to said frame;
    mounting means for releasably retaining at least one lens on said lens support with one of said major surfaces exposed;
    a mounting plate coupled to said frame and positioned proximate to said lens support;
    a series of work stations carried by said mounting plate, for sequentially performing work operations on said exposed major surface of said lens;
    indexing means for effecting relative motion between said mounting plate and said lens support, to position said exposed lens surface adjacent to each of said work stations, thereby facilitating the performance of said work operations on said exposed lens surface, said indexing means including a turntable for carrying said at least one lens support, said turntable being rotatably mounted to said frame adjacent to said mounting plate, said turntable defining a peripheral surface;
    a controller coupled to said apparatus for coordinating said work operations in response to lens coating data stored therein;
    turntable drive means for indexing said turntable adjacent to each of said plurality of work stations; said drive means includes a resilient wheel rotatably engaged with said peripheral surface, said resilient wheel being coupled to a servo motor responsive to commands issued from said controller;
    said drive means including a bracket pivotally mounted to said frame for carrying said servo motor; and
    means for pivotally adjusting said bracket relative to said peripheral surface of said turntable to vary the force exerted thereagainst by said resilient wheel.

30. An apparatus for coating a surface of at least one lens as defined by claim 29, wherein said means for pivotally adjusting said bracket includes a bolt extending through a coil spring for urging said bracket toward or away from said peripheral surface in response to rotation of said bolt, thereby increasing or decreasing the force exerted by said resilient wheel against said peripheral surface depending upon a direction in which said bolt is rotated.

31. An apparatus for coating a surface of at least one lens having pair of opposed major surfaces, said apparatus comprising:
    a frame;
    at least one lens support coupled to said frame:
    mounting means for releasably retaining at least one lens on said lens support with one of said major surfaces exposed;
    a mounting plate coupled to said frame and positioned proximate to said lens support;
    a series of work stations carried by said mounting plate, for sequentially performing work operations on said exposed major surface of said lens;

indexing means for effecting relative motion between said mounting plate and said lens support, to position said exposed lens surface adjacent to each of said work stations, thereby facilitating the performance of said work operations on said exposed lens surface;

a controller coupled to said apparatus for coordinating said work operations in response to lens coating data stored therein; and means for pressurizing said apparatus between said mounting plate and said indexing means.

32. An apparatus for coating a surface of at least one lens as defined by claim 31 wherein said means for pressurizing said apparatus includes a HEPA filter through which air laminarly passes.

33. A method for applying a coating to a surface of at least one lens, including the steps of:

providing an apparatus having at least one rotatable lens support adapted to carry at least one lens thereon, said apparatus further including a mounting plate for carrying a plurality of work stations, one of which is a wash station, one of which is a coating station, and one of which is a curing station, said apparatus including indexing means for sequentially positioning said lens support and thereby said exposed lens surface adjacent to each of said work stations in response to commands issued by a controller;

mounting a lens onto said lens support such that one of said major lens surfaces is exposed;

indexing said lens support relative to said mounting plate to position said exposed lens surface adjacent to said washing station;

depositing a washing fluid onto said exposed lens surface while said lens is rotating such that any excess washing fluid is expelled from said lens;

halting the rotation of said lens;

depositing a drying solution onto said exposed lens surface;

rotating said lens such that any excess drying solution is expelled from said lens;

indexing said lens support relative to said mounting plate to position said exposed lens surface adjacent to said coating station;

depositing at least one coating solution onto said exposed lens surface;

rotating said lens support to throw any excess coating solution from said exposed lens surface;

indexing said lens support relative to said mounting plate to position said exposed lens surface adjacent to said curing station;

flooding said curing station with a gas;

curing said exposed lens surface by directing ultraviolet radiation thereon to solidify said coating solution; and indexing said lens support relative to said mounting plate to position said exposed lens surface for removal from said apparatus.

34. A method for applying a coating to a surface of at least one lens as defined by claim 32, wherein said apparatus includes first and second lens supports, each for carrying a lens, wherein:

said step of indexing said lens support relative to said mounting plate to position said exposed lens surface adjacent to said washing station includes, simultaneously indexing said first lens support adjacent to said washing station;

said step of indexing said lens support relative to said mounting plate to position said exposed lens surface adjacent to said coating station includes, simultaneously indexing said second lens support adjacent to said washing station;

said step of depositing at least one coating solution onto said exposed lens surface includes, simultaneously applying said washing and drying solutions on said lens carried by said second lens support;

said step of indexing said lens support relative to said mounting plate to position said exposed lens surface adjacent to said curing station includes, simultaneously indexing said second lens support adjacent to said coating station;

said step of curing said exposed lens surface includes simultaneously depositing at least one coating solution onto said exposed lens surface carried by said second lens support;

said step of indexing said lens support relative to said mounting plate to position said exposed lens surface for removal from said apparatus includes simultaneously indexing said second lens support adjacent to said curing station; said method including the further steps of curing said exposed lens surface carried by said second lens support by directing ultraviolet radiation thereon to solidify said coating solution; and indexing said second lens support relative to said mounting plate to position said exposed lens surface for removal from said apparatus.

* * * * *